United States Patent [19]
Putzer

[11] 3,745,480
[45] July 10, 1973

[54] OSCILLATOR CIRCUIT FOR SEVERAL FREQUENCY RANGES HAVING PLURAL FEEDBACK PATHS

[75] Inventor: Walter Putzer, Krefeld, Germany

[73] Assignee: U.S. Philips Corporation, New York, N.Y.

[22] Filed: Mar. 10, 1972

[21] Appl. No.: 233,677

[30] Foreign Application Priority Data

Apr. 7, 1971 Germany .................. P 21 16 901.7

[52] U.S. Cl. .................... 331/60, 325/453, 325/459, 325/462, 325/464, 331/117 R, 331/177 V, 331/179, 334/15

[51] Int. Cl. .......... H03b 5/12, H03j 3/18, H03j 5/00

[58] Field of Search .............. 331/60, 117 R, 177 R, 331/177 V, 179; 334/15; 325/453, 459, 464, 462

[56] References Cited

UNITED STATES PATENTS

| | | | |
|---|---|---|---|
| 3,559,075 | 1/1971 | Okazaki | 325/459 |
| 3,564,423 | 2/1971 | Putzer | 325/462 |
| 3,624,514 | 11/1971 | Putzer | 334/15 X |

*Primary Examiner*—Roy Lake
*Assistant Examiner*—Siegfried H. Grimm
*Attorney*—Frank R. Trifari

[57] ABSTRACT

Oscillator circuit for several frequency ranges including for each range a frequency-determining resonant circuit having a tuning element, which are all simultaneously operated. From each of said resonant circuits a capacitive feedback path leads to a fixed parallel resonant circuit in the input circuit of an amplifying element.

10 Claims, 1 Drawing Figure

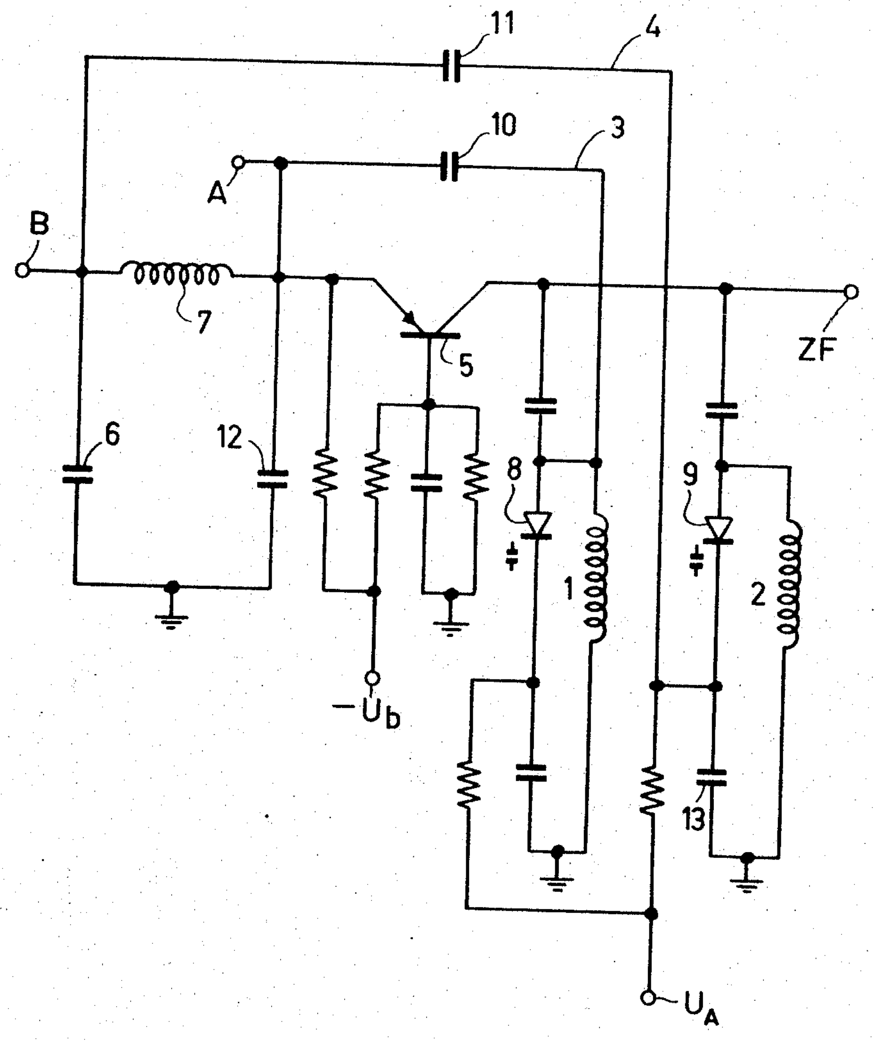
11
4
10
3
A
B
7
5
ZF
6
12
8
9
1
2
$-U_b$
13
$U_A$

OSCILLATOR CIRCUIT FOR SEVERAL FREQUENCY RANGES HAVING PLURAL FEEDBACK PATHS

The invention relates to a circuit arrangement for an oscillator for at least two frequency ranges including an amplifying element, in which a frequency-determining resonant circuit and an associated tuning element are connected to the output electrode for each frequency range and in which all tuning elements are operated in common.

Such oscillator circuits are used particularly for the input section of television receivers. As is known television reception frequencies are subdivided into several bands. For reducing the cost, the oscillator is to be used for several bands, if possible. However, special steps are required to cause the oscillator to oscillate always in the desired frequency region. To this end, for example, the resonant circuits or separate frequency-determining elements of the resonant circuit are switched over in known apparatus.

Generally, variable capacity diodes whose capacity can be varied by a voltage are used as tuning elements in the input section of television receivers. Such variable capacity diodes are, however, also used partly for switching over the resonant circuits for the different reception bands.

An oscillator circuit is also known in which only tuning voltage is required for tuning and for range switching because the oscillator automatically changes over to the next frequency range at a given value of the tuning voltage when the tuning voltage varies continuously. This is achieved in that a resonant circuit having a special feedback path is provided for each frequency range, which feedback paths operate every time only in the desired frequency range due to the use of extra filters. These filters, however, involve given costs because minimum requirements are to be imposed thereon when faultless switching over of one frequency range to the other is to be ensured.

An object of the present invention is to provide a circuit arrangement in which the automatic change-over from one frequency range to the other at a given tuning voltage is effected at low cost and to this end the circuit arrangement is characterized in that a capacitive feedback path is provided for each frequency-determining resonant circuit, which path leads from the relevant frequency-determining resonance circuit to a parallel resonant circuit one branch of which includes the input electrodes of the amplifying element, the values of the elements in the feedback paths and in said parallel resonant circuit being chosen to be such that every time the conditions of self-oscillation are satisfied only in a part of the tuning range of each frequency-determining circuit. In this manner an oscillator circuit is obtained in which with extremely low cost a change-over from one frequency range to the other is made possible. This oscillator circuit may alternatively be used advantageously as a self-oscillating mixer stage in which the input signals of each frequency range is applied to the end of the feedback path remote from the associated frequency-determining resonant circuit. As a result the input signals of the separate frequency ranges can influence or damp each other to a lesser extent.

In order that the invention may be readily carried into effect, an embodiment thereof will now be described in detail by way of example with reference to the accompanying diagrammatic drawing. In this drawing the amplifying element is represented by a transistor 5 in common base configuration whose emitter constitutes the input and whose collector constitutes the output. Two resonant circuits 1 and 2 are coupled to the collector which circuits each return through feedback paths 3 and 4, respectively, to the emitter of the transistor. Resonant circuit 1 is proportioned for the highest frequency range to be generated and the associated feedback path 3 leads through a capacitor 10 of low capacitance directly to the emitter of transistor 5. The input resistance of the emitter has an inductive component which is completed to a parallel-arranged resonant circuit by a capacitor 12. However, this resonant circuit is extremely attenuated due to the effective resistance of the emitter and therefore it has a very broad band.

The resonant circuits 1 and 2 are tuned by means of the variable capacity diodes 8 and 9 whose capacity is jointly adjusted by the tuning voltage $U_A$. At the highest tuning voltage the capacity of the two variable capacity diodes 8 and 9 is always at a minimum so that the two resonant circuits 1 and 2 are always adjusted at their maximum frequency which frequencies are, however, different. At the highest frequency of the resonant circuit 2 the feedback path 4 is proportioned in such a manner that the amplitude or phase condition required for self-oscillation is not satisfied, as will be described hereinafter, so that the oscillator cannot oscillate at this frequency. At the highest frequency of the resonant circuit 1 which is considerably higher, a suitable choice of the capacitance of capacitor 10 satisfies the condition of self-oscillation so that the oscillator oscillates at this frequency.

However, in case of a decreasing tuning voltage $U_A$ the capacity of the variable capacity diodes 8 and 9 increases and hence the adjusted frequency of the resonant circuits 1 and 2 decreases so that, however, the resonant circuit 1 initially remains frequency-determining. Only at a given frequency the phase condition for self-oscillation is no longer satisfied due to a given value of the capacitance of capacitor 10 in conjunction with the resonant circuit constituted by the input inductance of the emitter of transistor 5 and capacitor 12 so that oscillation stops. In that case the condition of self-oscillation in the feedback path 4 is preferably not yet satisfied at the frequency at which the resonant circuit 2 is adjusted at this tuning voltage so that the oscillator stops oscillating.

Feedback path 4 leads through capacitor 11 to a capacitor 6 and through coil 7 to the emitter of transistor 5. Capacitor 6 and coil 7 constitute together with the other elements which are directly connected to the emitter of transistor 5 and together with the input resistance of the emitter a resonant circuit which is only attenuated to a slight extent due to the resistive part of the input impedance of the emitter and therefore this circuit has a narrow band. The resonant frequency of this resonant circuit is adjusted in such a manner that this frequency lies below the frequency at which resonant circuit 2 is adjusted just when the resonances discontinue in the resonant circuit 1. At this adjusted frequency of resonant circuit 2 the resonant circuit consisting of capacitor 6 and coil 7 operates capacitively and at a low resistivity so that for a low value of the capacitance of capacitor 11 there is an insufficient feedback voltage at the emitter of transistor 5. Only when the tuning voltage $U_A$ decreases to a further extent so that the capcity of variable capacity diode 9 increases and hence the adjusted frequency of resonant circuit 2 decreases, the resonant circuit 6, 7 quickly assume a higher resistivity so that the condition for feedback is satisfied and the oscillator only operates at the frequency adjusted for resonant circuit 2. In this manner the oscillator changes over from one frequency range to the other in which in a given range of the tuning voltage $U_A$ a desired oscillation-free space may be produced. In case of a further decrease of the tuning voltage $U_A$ the oscillator operates on the frequency determined by resonant circuit 2.

The capacitor of resonant circuit 2 is subdivided into two parts 9 and 13 which are serially arranged with respect to each other and feedback path 4 is connected to the junction of these two capacitors. In case of a decreasing frequency of resonant circuit 2, which is brought about by an increase of the capacity of the variable capacity diode, the component of the overall voltage occurring across capacitor 13 thus increases so that the condition for feedback at lower frequencies is better satisfied.

If the oscillator is to change over in another frequency range, another resonant circuit in conformity with resonant circuit 2 is to be provided to which an additional feedback path in conformity with feedback path 4 is connected which also leads to a capacitor and a coil. These again constitute a resonant circuit which is tuned to a frequency in the corresponding low-frequency range. In this case the oscillations of the frequency determined by resonant circuit 2 discontinue at a given frequency which lies so far below the resonant frequency of the correspondingly proportioned resonant circuit 6, 7 that the conditions of self-oscillation are no longer satisfied in this case. The resonant circuit of the additional feedback path is then such that the conditions of self-oscillation are only satisfied when the frequency of the other resonant circuit further decreases. The coils for the additional feedback paths may be either directly connected to the emitter of transistor 5 or they may be arranged in series, while the coil having the lowest inductance, that is to say, for the highest frequency range is located closest to the emitter of the transistor.

This oscillator circuit may alternatively be used in known manner as a self-oscillating mixer stage. In that case the H.F.-input signals of the separate frequency ranges can be fed in an advantageous manner to different points in the oscillator circuit. These points are essentially the terminals of the feedback capacitor, which terminals are remote from the resonant circuit for the corresponding frequency range and which are denoted in the Figure by A and B. Thus the input signal of the highest frequency range is fed to terminal A while the input signal of the lower frequency range located immediately below the highest frequency range is fed to terminal B. A satisfactory mutual decoupling and a smaller load of the input signal is thus produced at coil 7.

What is claimed is

1. A circuit arrangement for an oscillator for at least two frequency ranges including an amplifying element, in which a frequency-determining resonant circuit and an associated tuning element are connected to the output electrode for each frequency range and in which all tuning elements are operated in common, characterized that a capacitive feedback path is provided for each frequency-determining resonant circuit, which path leads from the relevant frequency-determining resonant circuit to a parallel resonant circuit one branch of which includes the input electrodes of the amplifying element, the values of the elements in the feedback paths and in said parallel resonant circuit being chosen to be such that the conditions of self-oscillation are satisfied only in mutually exclusive parts of the tuning range of each frequency-determining resonant circuit.

2. A circuit arrangement as claimed in claim 1, characterized in that an impedance relative to ground is connected to the input of the amplifying element such that this impedance together with the input impedance of the amplifying element, is in a resonance at a frequency which is located in the highest frequency range to be generated and the feedback path of the highest frequency range being chosen to be such that the conditions of self-oscillation are no longer satisfied below the lowest oscillator frequency to be generated in said frequency range.

3. A circuit arrangement as claimed in claim 1 characterized in that the elements of the parallel resonant circuit are chosen to be such that they constitute a narrow-band parallel circuit whose resonant frequency is located so far below the highest frequency to be generated in this range that the conditions of self-oscillation above said highest frequency to be generated are not satisfied.

4. A circuit arrangement as claimed in claim 1, characterized in that at least for the frequency-determining resonant circuit for the lowest frequency range the capacitor of the resonant circuit consists of the series arrangement of a variable capacitor and a fixed capacitor connected to ground and that the feedback path is connected to the junction of the two capacitors.

5. A circuit arrangement as claimed in claim 1 for use as a self-oscillating mixer stage, characterized in that the input signal of each frequency range is applied to the terminal of the feedback path remote from the associated frequency-determining resonant circuit.

6. A circuit comprising an amplifying means having an input and an output; at least two resonant circuits coupled to said output and having low and high frequency ranges respectively, each of said resonant circuits having a tuning element; means coupling said tuning elements together for a common tuning control; and means for causing oscillation using said resonant circuits in mutually exclusive portions of the tuning range comprising a parallel resonant circuit coupled to said input, and two feedback circuits coupled to said high and low frequency resonant circuits respectively and to said parallel resonant circuit.

7. A circuit as claimed in claim 6 further comprising means for preventing oscillation below the lowest frequency of said high frequency range using said high frequency circuit comprising an impedance element coupled between said input and ground which resonates together with the amplifying means input impedance at a frequency within said high frequency range.

8. A circuit as claimed in claim 6 further comprising means for preventing oscillation using said low frequency circuit above the lowest frequency of said high frequency range comprising said parallel resonant circuit comprising a narrow band circuit having a resonant frequency below the highest frequency of said high frequency range.

9. A circuit as claimed in claim 6 wherein said low frequency resonant circuit tuning element comprises a variable capacitor and a fixed capacitor series coupled to said variable capacitor, said low frequency feedback circuit being coupled to the junction of said capacitors.

10. A circuit as claimed in claim 6 further comprising means for utilizing said circuit as a self oscillating mixer stage comprising a pair of input means respectively coupled to to the ends of said feedback means that are coupled to said parallel resonant circuit.

* * * * *